(12) United States Patent
Chandra (10) Patent No.: US 11,924,962 B2
(45) Date of Patent: Mar. 5, 2024

(54) PRINTED CIRCUIT BOARD (PCB) INCLUDING HEATSINKS

(71) Applicant: Dell Products L.P., Round Rock, TX (US)

(72) Inventor: Umesh Chandra, Santa Cruz, CA (US)

(73) Assignee: Dell Products L.P., Round Rock, TX (US)

( * ) Notice: Subject to any disclaimer, the term of this patent is extended or adjusted under 35 U.S.C. 154(b) by 190 days.

(21) Appl. No.: 17/451,710

(22) Filed: Oct. 21, 2021

(65) Prior Publication Data

US 2023/0126467 A1    Apr. 27, 2023

(51) Int. Cl.
*H05K 1/02* (2006.01)
*H05K 1/11* (2006.01)

(52) U.S. Cl.
CPC ......... *H05K 1/0206* (2013.01); *H05K 1/0218* (2013.01); *H05K 1/0298* (2013.01); *H05K 1/116* (2013.01)

(58) Field of Classification Search
CPC ..... H05K 1/0201–0212; H05K 1/0181; H05K 1/0218; H05K 1/0272; H05K 1/0298; H05K 1/05; H05K 1/111; H05K 1/115–116; H05K 1/185; H05K 7/20; H05K 7/20436; H05K 7/2039; H05K 7/20454; H05K 7/20463; H05K 7/20471; H05K 7/205; H05K 7/2089–209; H05K 2201/06–068; H05K 2201/09; H05K 2201/09871; H05K 2201/10416; H05K 3/0061; H05K 3/06; H05K 3/066; H05K 3/09563; H05K 3/0323; H05K 3/30; H05K 3/4647; H05K 3/4038; H01L 23/3672; H01L 23/3735; H01L 23/4062; H01L 23/4068; H01L 23/49822; H01L 23/66; H01L 21/4857; H01L 24/32; H01L 2023/6605; H01L 35/30
See application file for complete search history.

(56) References Cited

U.S. PATENT DOCUMENTS

| | | | |
|---|---|---|---|
| 8,773,852 B2 * | 7/2014 | Singleton | H05K 7/20836 361/679.48 |
| 9,661,738 B1 * | 5/2017 | Jacobsson | H05K 1/0206 |
| 2009/0041994 A1 * | 2/2009 | Ockenfuss | H01L 24/82 428/209 |
| 2012/0307466 A1 * | 12/2012 | Fujidai | H01L 24/18 361/763 |
| 2014/0355215 A1 * | 12/2014 | Canete | H01L 23/49827 361/720 |
| 2016/0249445 A1 * | 8/2016 | Min | H05K 3/4608 |
| 2016/0302298 A1 * | 10/2016 | Min | H01L 23/49822 |
| 2017/0251548 A1 * | 8/2017 | Min | H05K 1/0203 |

* cited by examiner

*Primary Examiner* — Amir A Jalali
(74) *Attorney, Agent, or Firm* — McDermott Will & Emery LLP (57) ABSTRACT

A printed circuit board (PCB), including: a processing unit; a plurality of layers; and a plurality of vias, each via extending through two or more of the layers, wherein a first via of the plurality of vias has a first pad at a first layer of the plurality of layers and a second via of the plurality of vias has a second pad at the first layer of the plurality of layers, wherein the first pad is conjoined with the second pad to form a first heatsink at the first layer that dissipates heat away from the processing unit.

12 Claims, 7 Drawing Sheets

FIG. 6

PRINTED CIRCUIT BOARD (PCB) INCLUDING HEATSINKS

BACKGROUND

Field of the Disclosure

The disclosure relates generally to an information handling system, and in particular, a printed circuit board of the information handling system that includes heatsinks.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As the data rate and sizes of processing chips are increased, dissipation of heat that is generated by such processing chips is increasingly difficult (e.g., at double density port configurations of network process units). Fans and resultant air flow may not be sufficient for such heat dissipation.

SUMMARY

Innovative aspects of the subject matter described in this specification may be embodied in a printed circuit board (PCB), including: a processing unit; a plurality of layers; and a plurality of vias, each via extending through two or more of the layers, wherein a first via of the plurality of vias has a first pad at a first layer of the plurality of layers and a second via of the plurality of vias has a second pad at the first layer of the plurality of layers, wherein the first pad is conjoined with the second pad to form a first heatsink at the first layer that dissipates heat away from the processing unit.

Other embodiments of these aspects include corresponding systems and apparatus.

These and other embodiments may each optionally include one or more of the following features. For instance, the first layer is an internal layer of the plurality of layers. A third via of the plurality of vias has a third pad at the first layer of the plurality of layers and a fourth via of the plurality of vias has a fourth pad at the first layer of the plurality of layers, wherein the third pad is conjoined with the fourth pad to form a second heatsink at the first layer that dissipates heat away from the processing unit. A fifth via of the plurality of vias has a fifth pad at the first layer of the plurality of layers, wherein the first pad, the second pad, and the fifth pad are conjoined to form the first heatsink. A sixth via of the plurality of vias has a sixth pad at a second layer of the plurality of layers and an seventh via of the plurality of vias has an seventh pad at the second layer of the plurality of layers, wherein the sixth pad is conjoined with the seventh pad to form a third heatsink at the second layer that dissipates heat away from the processing unit. An eight via of the plurality of vias has an eighth pad at a second layer of the plurality of layers, wherein the sixth pad, the seventh pad, and the eighth pad are conjoined to form the third heatsink. The second layer is an internal layer of the plurality of layers. The PCB is a network switch chassis board and the processing unit is a network processing unit. The plurality of layers includes a ground plane layer.

Particular implementations of the subject matter described in this specification can be implemented so as to realize one or more of the following advantages. For example, efficiency of heat removal away from the printed circuit board is improved.

The details of one or more embodiments of the subject matter described in this specification are set forth in the accompanying drawings and the description below. Other potential features, aspects, and advantages of the subject matter will become apparent from the description, the drawings, and the claims.

DESCRIPTION OF PARTICULAR EMBODIMENT(S)

This disclosure discusses a printed circuit board of an information handling system including heatsinks. In short, heat can be generated by a processing unit of the printed circuit board. Such heat can be dissipated by internal heatsinks of the printed circuit board that are formed from previously unused ground pads of internal layers that are connected together, described further herein.

Specifically, this disclosure discusses a printed circuit board (PCB), including: a processing unit; a plurality of layers; and a plurality of vias, each via extending through two or more of the layers, wherein a first via of the plurality of vias has a first pad at a first layer of the plurality of layers and a second via of the plurality of vias has a second pad at the first layer of the plurality of layers, wherein the first pad is conjoined with the second pad to form a first heatsink at the first layer that dissipates heat away from the processing unit.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-5 wherein like numbers are used to indicate like and corresponding parts.

Figure 1:
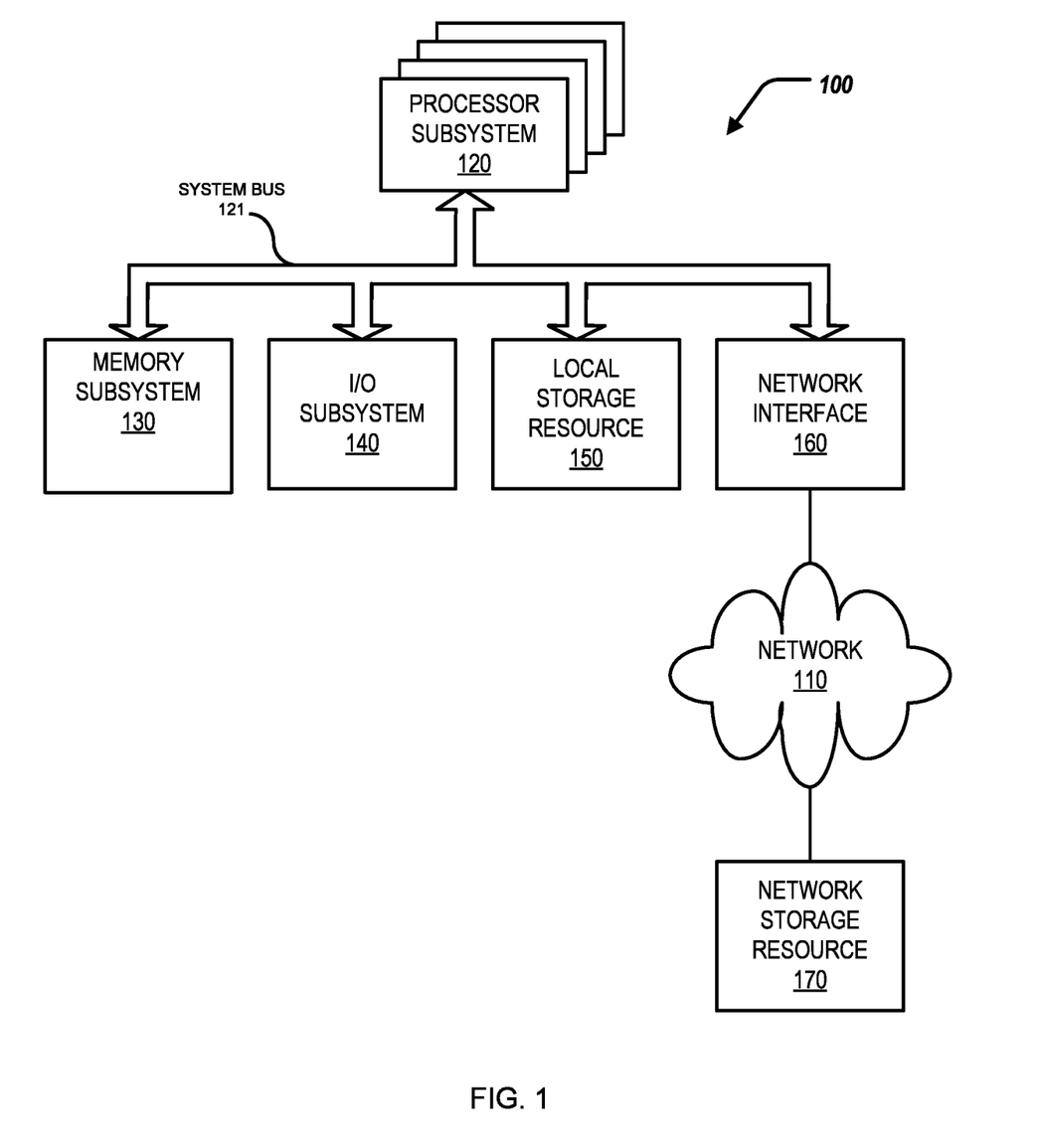
FIG. 1 is a block diagram of selected elements of an embodiment of an information handling system.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

Figure 2:
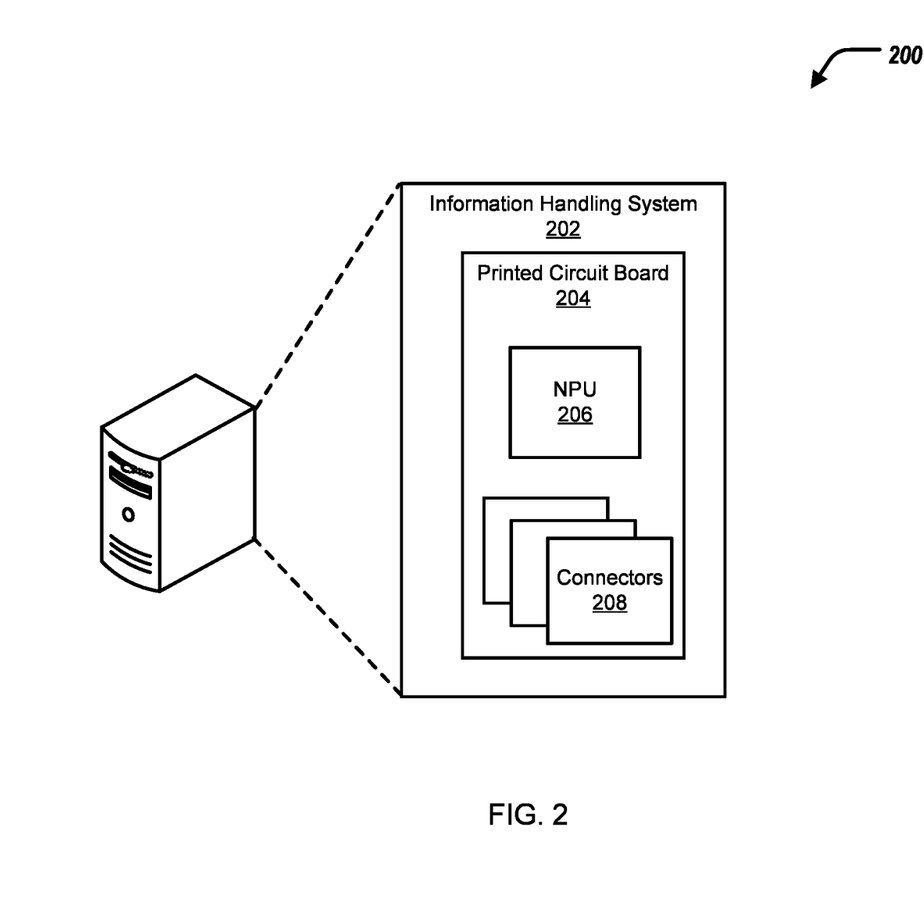
FIG. 2 illustrates a block diagram of an information handling system including a printed circuit board.

Turning to FIG. 2, FIG. 2 illustrates an environment 200 including an information handling system 202. The information handling system 202 can include a printed circuit board (PCB) 204. The printed circuit board 204 can include a network processing unit (NPU) 206 and connectors 208. In some examples, the information handling system 202 is similar to, or includes, the information handling system 100 of FIG. 1.

In short, heat can be generated by the NPU 206. Such heat can be dissipated by internal heatsinks of the PCB 204 that are formed from previously unused ground pads of internal layers that are connected together, described further herein.

Figure 3A:
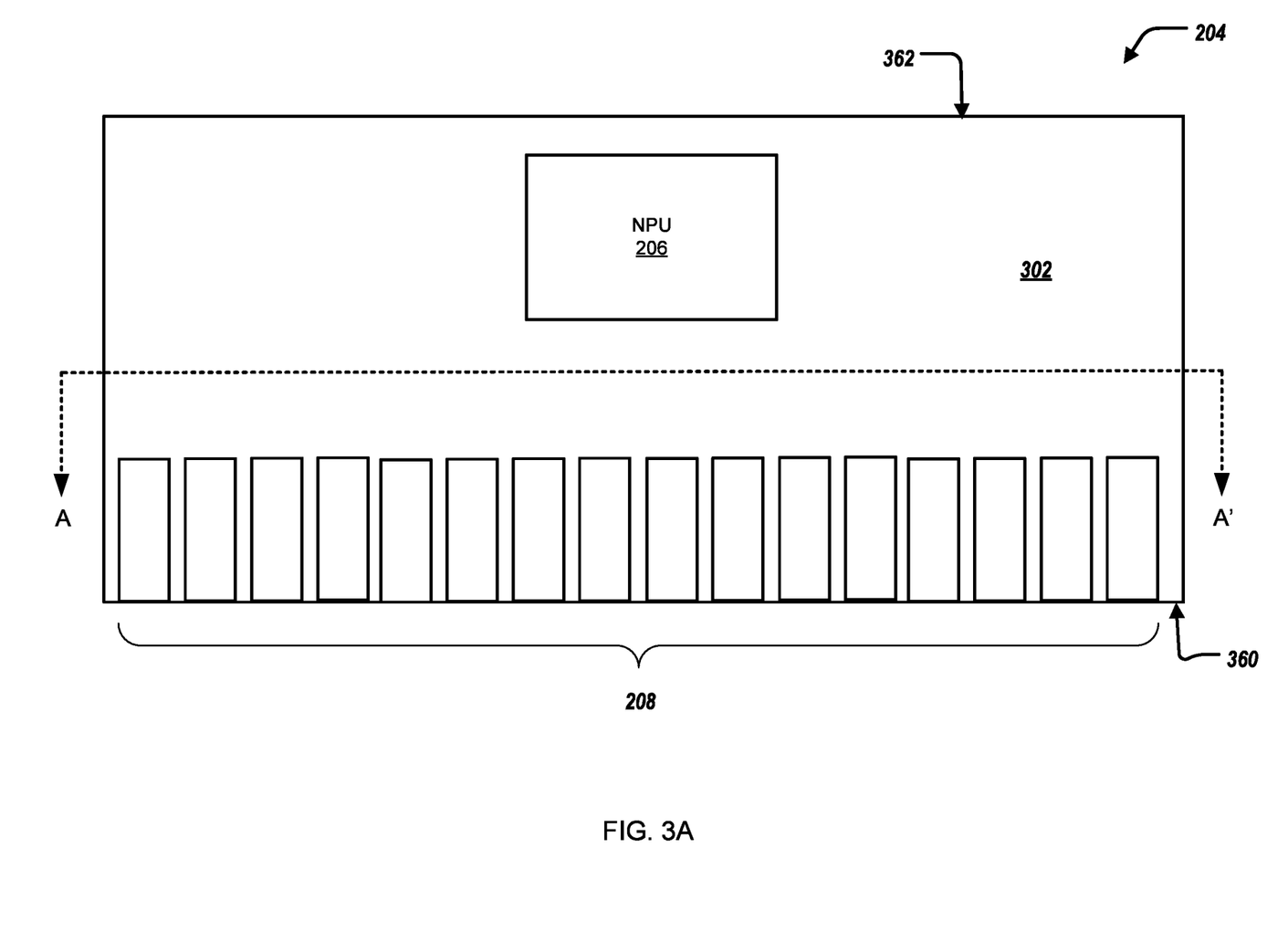
FIGS. 3A, 3B illustrate the printed circuit board.
Figure 3B:
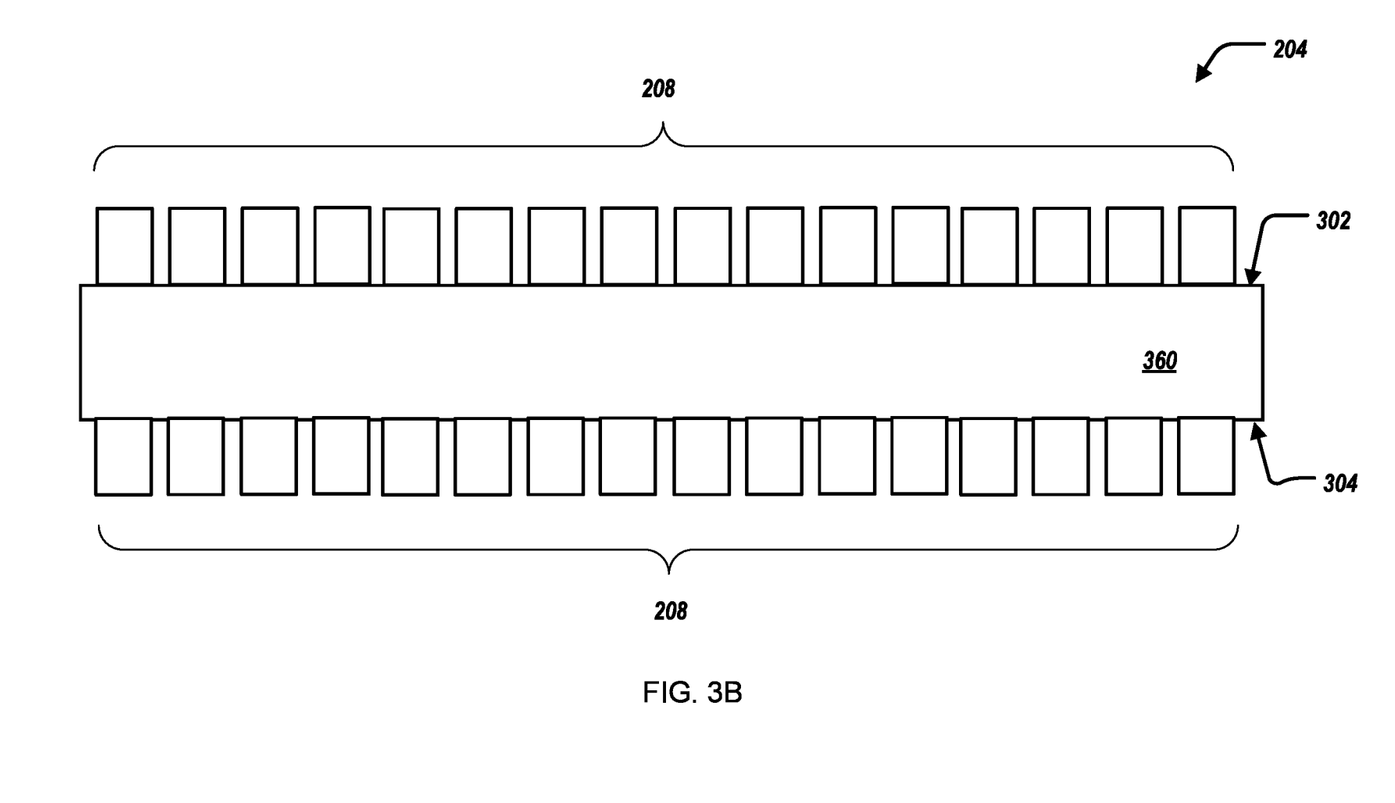

Referring to FIGS. 3A, 3B, FIG. 3A illustrates a top down view of the PCB 204; and FIG. 3B illustrates a side view of the PCB 204. In some cases, the PCB 204 is a network switch chassis board that uses quad small form-factor pluggable (SQFP) double density (DD) or octal small form-factor pluggable (OSFP) connectors for input/output (IO) ports. The connectors 208 can be mounted on a top side 302 and a bottom side 304 of the PCB 204, with the top side 302 opposite to the bottom side 304 (e.g., a belly-to-belly configuration). Further, the connectors 208 can extend from a first side 360 of the PCB 204 towards a second side 362. In some examples, the PCB 204 (switch chassis) can include 32 connectors 208 (ports), 16 positioned on the top side 302 and 16 positioned on the bottom side 304. In some examples, the PCB 204 can include 64 ports (double density)—32 connectors 208 (ports) positioned on the top side 302 and 32 connectors 208 (ports) positioned on the bottom side 304.

In some examples, the PCB 204 can further include a heatsink (not shown) positioned on the top side 302 overlapping the NPU 206. In some examples, the PCB 204 can include an additional heatsink (not shown) positioned on the bottom side 304 adjacent to the NPU 206.

Figure 4:
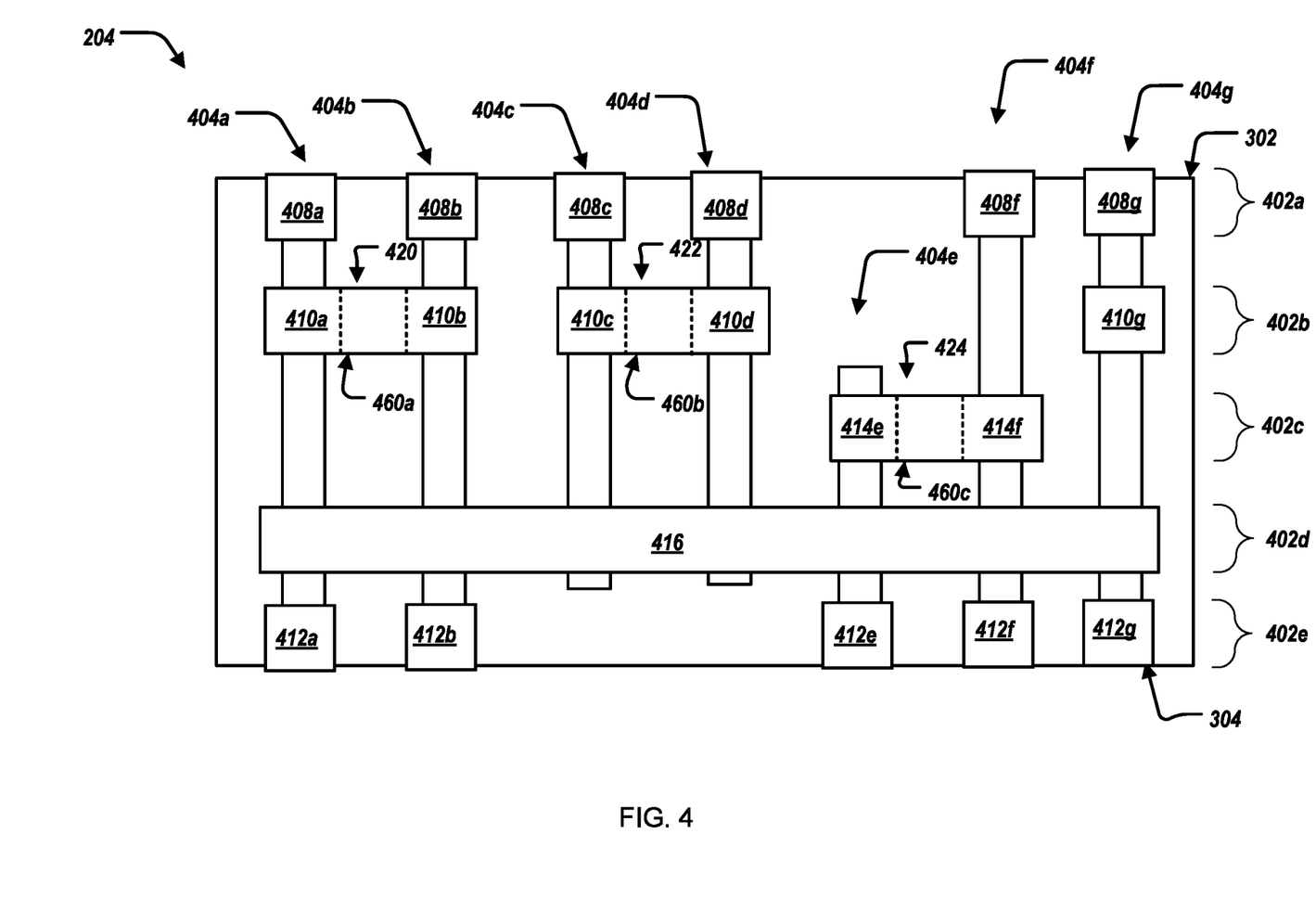
FIG. 4 illustrates a side view of the printed circuit board, in a first implementation.

FIG. 4 illustrates a side cutaway view of the PCB 204 along a line A-A' of the PCB 204 shown in FIG. 3A, in a first implementation. Specifically, the PCB 204 can include a plurality of layers 402a, 402b, 402c, 402d, 402e (collectively referred to as layers 402). The layers 402b, 402c, 402d can be internal layers.

The PCB 204 can further include a plurality of vias 404a, 404b, 404c, 404d, 404e, 404f, 404g (collectively referred to as vias 404). The vias 404 can extend through two or more of the layers 402. For example, the vias 404a, 404b, 404f, 404g extend through the layers 402a-402e; the vias 404c, 404d extend through the layers 402a-402d; and the via 404e extends through the layers 402c-402e.

The via 404a can include a pad 408a at the layer 402a; a pad 410a at the layer 402b; and a pad 412a at the layer 402e. The via 404b can include a pad 408b at the layer 402a; a pad 410b at the layer 402b; and a pad 412b at the layer 402e. The via 404c can include a pad 408c at the layer 402a; and a pad 410c at the layer 402b. The via 404d can include a pad 408d at the layer 402a; and a pad 410d at the layer 402b. The via 404e can include a pad 414e at the layer 402c; and a pad 412e at the layer 402e. The via 404f can include a pad 408f at the layer 402a; a pad 414f at the layer 402c; and a pad 412f at the layer 402e. The via 404g can include a pad 408g at the layer 402a; a pad 410g at the layer 402b; and a pad 412g at the layer 402e.

Pads 408a, 408b, 408c, 408d, 408f, 408g, 410a, 410b, 410c, 410d, 410g, 414e, 414f, 412a, 412b, 412e, 412f, 412g can be collectively referred to as pads 400.

The vias 404 can function as an electrical connection between the layers 402 of the PCB 204 (e.g., traces of the layers 402). The vias 404 can be formed in the PCB 204 by drilling a hole through two or more of the layers 402. The drilled hole can be plated (by electroplating) with an electrically conductive material (e.g., copper) that forms the electrical connection between two or more of the layers 402, and the pads 400 at respective layers 402.

In some examples, the PCB 204 can further include a ground plane layer 416 at the layer 402d. In some examples, the PCB 204 can further include a power plane layer 416 at the layer 402d.

In some examples, the pad 410a and the pad 410b are conjoined (coupled) by a bridging connector 460a to form a heatsink 420 (or a heatsink fin) (thermal pad via heat sink) at the layer 402b. That is, the pads 410a, 410b and the bridging connector 460a form the heatsink 420. The heatsink 420 can dissipate heat away from the NPU 206. In some examples, the pad 410c and the pad 410d are conjoined (coupled) by a bridging connector 460b to form a heatsink 422 (or a heatsink fin) (thermal pad via heat sink) at the layer 402b. That is, the pads 410c, 410d and the bridging connector 460b form the heatsink 420. The heatsink 422 can dissipate heat away from the NPU 206. In some examples, the pad 414e and the pad 414f are conjoined (coupled) by a bridging connector 460c to form a heatsink 424 (or a heatsink fin) (thermal pad via heat sink) at the layer 402c.

That is, the pads 414e, 414f and the bridging connector 460c form the heatsink 420. The heatsink 424 can dissipate heat away from the NPU 206.

The bridging connectors 460a, 460b, 460c can be collectively referred to as bridging connectors 460. The bridging connectors 460 can be formed from an electrically conductive material (e.g., copper). The bridging connectors 460 can be formed during layout formation of traces of the PCB 204.

During the plating of the drilled holes that form the vias 404 and the pads 400, the plating process can conjoin (couple) the pads 400 with the respective bridging connectors such that a physical connection between respective pads 400 and bridging connectors 460 is formed. For example, electroplating of the vias 404a and 404b can form the physical connection between the pads 410a, 410b and the bridging connector 460a to form the heatsink 420; electroplating of the vias 404c and 404d can form the physical connection between the pads 410c, 410d and the bridging connector 460b to form the heatsink 422; and electroplating of the vias 404e and 404f can form the physical connection between the pads 414e, 414f and the bridging connector 460c to form the heatsink 424.

Figure 5:
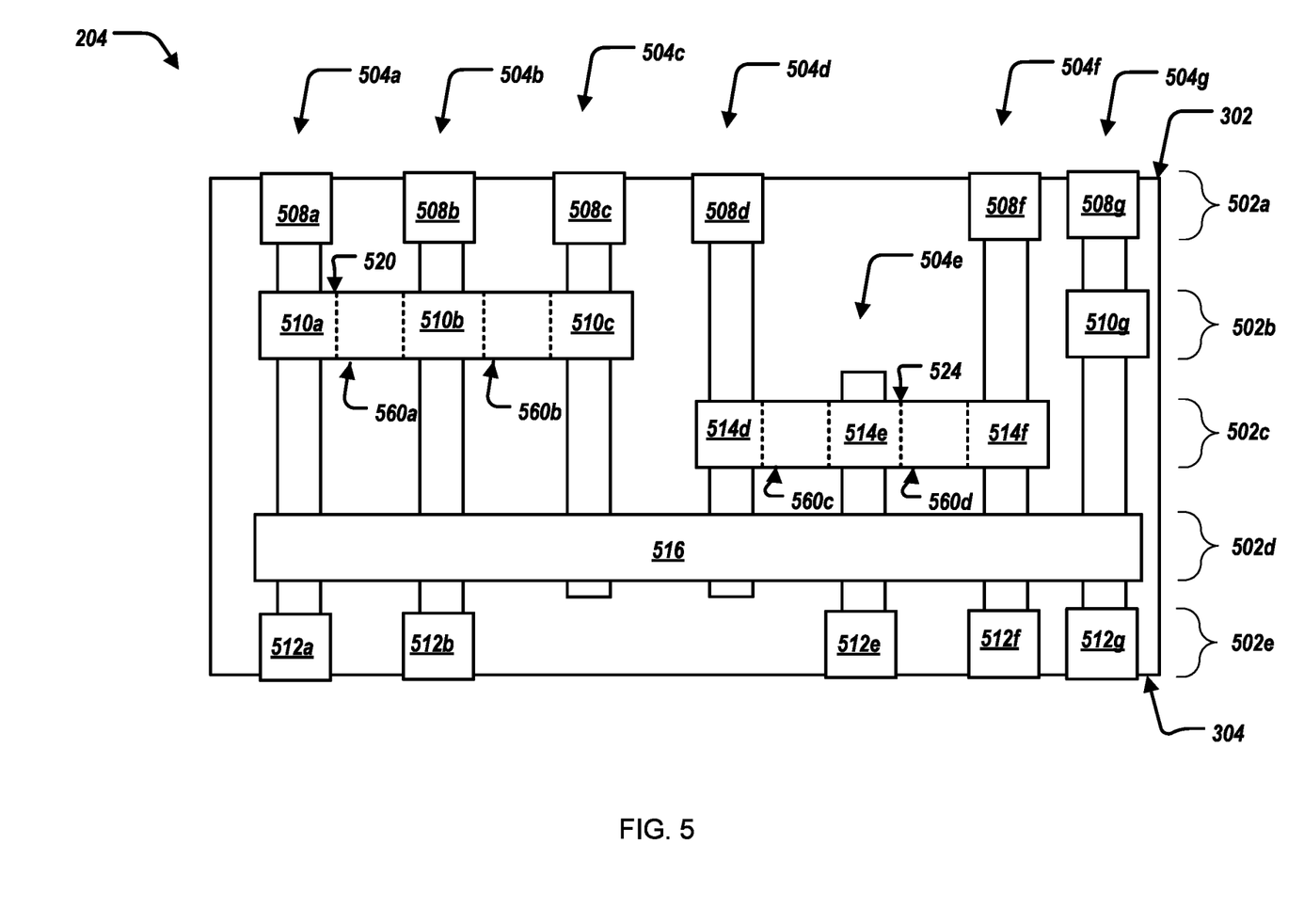
FIG. 5 illustrates a side view of the printed circuit board, in a second implementation.

FIG. 5 illustrates a side cutaway view of the PCB 204 along the line A-A' of the PCB 204 shown in FIG. 3A, in a second implementation. Specifically, the PCB 204 can include a plurality of layers 502a, 502b, 502c, 502d, 502e (collectively referred to as layers 502). The layers 502b, 502c, 502d can be internal layers.

The PCB 204 can further include a plurality of vias 504a, 504b, 504c, 504d, 504e, 504f, 504g (collectively referred to as vias 504). The vias 504 can extend through two or more of the layers 502. For example, the vias 504a, 504b, 504f, 504g extend through the layers 502a-502e; the vias 504c, 504d extend through the layers 502a-502d; and the via 504e extends through the layers 502c-502e.

The via 504a can include a pad 508a at the layer 502a; a pad 510a at the layer 502b; and a pad 512a at the layer 502e. The via 504b can include a pad 508b at the layer 502a; a pad 510b at the layer 502b; and a pad 512b at the layer 502e. The via 504c can include a pad 508c at the layer 502a; and a pad 510c at the layer 502b. The via 504d can include a pad 508d at the layer 502a; and a pad 514d at the layer 502c. The via 504e can include a pad 514e at the layer 502c; and a pad 512e at the layer 502e. The via 504f can include a pad 508f at the layer 502a; a pad 514f at the layer 502c; and a pad 512f at the layer 502e. The via 504g can include a pad 508g at the layer 502a; a pad 510g at the layer 502b; and a pad 512g at the layer 502e.

Pads 508a, 508b, 508c, 508d, 508f, 508g, 510a, 510b, 510c, 510g, 514d, 514e, 514f, 512a, 512b, 512e, 512f, 512g can be collectively referred to as pads 500.

The vias 504 can function as an electrical connection between the layers 502 of the PCB 204 (e.g., traces of the layers 402). The vias 504 can be formed in the PCB 204 by drilling a hole through two or more of the layers 502. The drilled hole can be plated (by electroplating) with an electrically conductive material (e.g., copper) that forms the electrical connection between two or more of the layers 502, and the pads 500 at respective layers 502.

The PCB 204 can further include a ground plane layer 516 at the layer 502d. In some examples, the PCB 204 can further include a power plane layer 516 at the layer 502d.

In some examples, the pads 510a, 510b, 510c are conjoined (coupled) by bridging connectors 560a, 560b to form a heatsink 520 (or a heatsink fin) (thermal pad via heat sink) at the layer 502b. That is, the pads 510a, 510b, 510c and the bridging connectors 560a, 560b form the heatsink 520. Specifically, the bridging connector 560a connects the pads 510a, 510b; and the bridging connector 560b connects the pads 510b, 510c. The heatsink 520 can dissipate heat away from the NPU 206. In some examples, the pads 514d, 514e, 514f are conjoined (coupled) by bridging connectors 560c, 560d to form a heatsink 524 (or a heatsink fin) (thermal pad via heat sink) at the layer 502c. That is, the pads 514d, 514e, 514f and the bridging connectors 560c, 560d form the heatsink 524. Specifically, the bridging connector 560c connects the pads 514d, 514e; and the bridging connector 560d connects the pads 514e, 514f. The heatsink 524 can dissipate heat away from the NPU 206.

The bridging connectors 560a, 560b, 560c, 560d can be collectively referred to as bridging connectors 560. The bridging connectors 560 can be formed from an electrically conductive material (e.g., copper). The bridging connectors 560 can be formed during layout formation of traces of the PCB 204.

During the plating of the drilled holes that form the vias 504 and the pads 500, the plating process can conjoin (couple) the pads 500 with the respective bridging connectors such that a physical connection between respective pads 500 and bridging connectors 560 is formed. For example, electroplating of the vias 508a, 508b, 508c can form the physical connection between the pads 510a, 510b, 510c and the bridging connectors 560a, 560b to form the heatsink 520; and electroplating of the vias 504d, 504e, 504f can form the physical connection between the pads 514d, 514e, 514f and the bridging connectors 560c, 560d to form the heatsink 524.

In some examples, the pads (410a, 410b, 410c, 410d, 510a, 510b, 510c, 514d, 514e, 514f) are previously unused ground pads. In some examples, the pads (410a, 410b, 410c, 410d, 510a, 510b, 510c, 514d, 514e, 514f) are power unused pads/vias and/or low speed-signal unused pads/vias.

In some examples, a thickness of the pads 400, 500 (plating thickness) is increased, e.g., from 1 mil to between 2-3 mils. As a result, a wall thickness of the vias 404, 504 (plated vias) is increased to more efficiently conduct heat through the PCB 204.

In some examples, the heat sinks (e.g., heatsinks 420, 422, 424, 520, 524) can dissipate heat away from the NPU 206, through the PCB 204 at the top surface 302 and/or the bottom surface 304, where air flow is used to dissipate the heat created.

Figure 6:
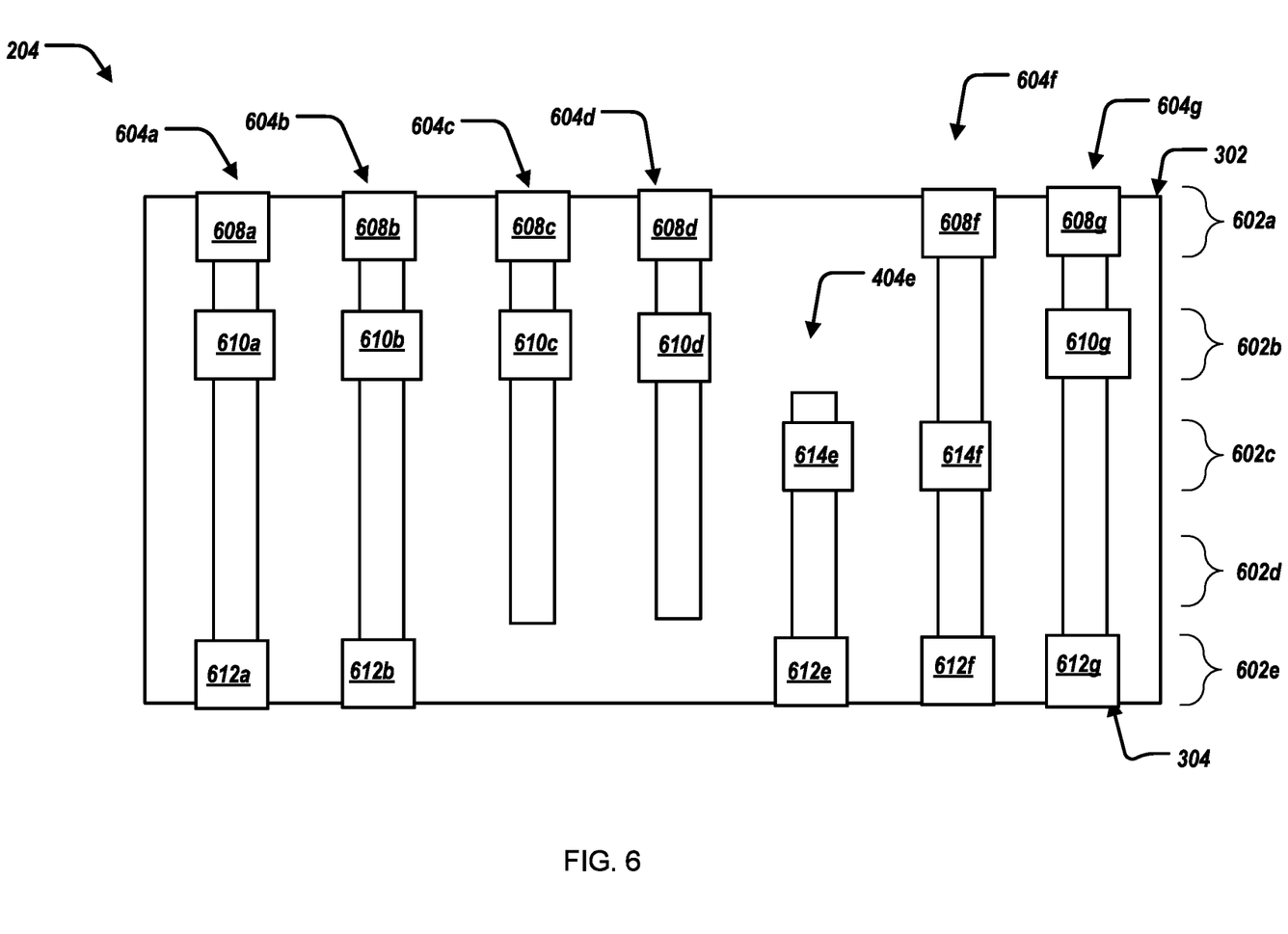
FIG. 6 illustrates a side view of the printed circuit board, in a third implementation.

FIG. 6 illustrates a side cutaway view of the PCB 204 along a line A-A' of the PCB 204 shown in FIG. 3A, in a third implementation. Specifically, the PCB 204 can include a plurality of layers 602a, 602b, 602c, 602d, 602e (collectively referred to as layers 602). The layers 602b, 602c, 602d can be internal layers.

The PCB 204 can further include a plurality of vias 604a, 604b, 604c, 604d, 604e, 604f, 604g (collectively referred to as vias 604). The vias 604 can extend through two or more of the layers 602. For example, the vias 604a, 604b, 604f, 604g extend through the layers 602a-602e; the vias 604c, 604d extend through the layers 602a-602d; and the via 604e extends through the layers 602c-602e.

The via 604a can include a pad 608a at the layer 602a; a pad 610a at the layer 602b; and a pad 612a at the layer 602e. The via 604b can include a pad 608b at the layer 602a; a pad 610b at the layer 602b; and a pad 612b at the layer 602e. The via 604c can include a pad 608c at the layer 602a; and a pad 610c at the layer 602b. The via 604d can include a pad 608d at the layer 602a; and a pad 610d at the layer 602b. The via 604e can include a pad 614e at the layer 602c; and a pad 612e at the layer 602e. The via 604f can include a pad 608f at the layer 602a; a pad 614f at the layer 602c; and a pad 612f at the layer 602e. The via 604g can include a pad 608g at the layer 602a; a pad 610g at the layer 602b; and a pad 612g at the layer 602e.

Pads 608a, 608b, 608c, 608d, 608f, 608g, 610a, 610b, 610c, 610d, 610g, 614e, 614f, 612a, 612b, 612e, 612f, 612g can be collectively referred to as pads 600.

The vias 604 can function as an electrical connection between the layers 602 of the PCB 204 (e.g., traces of the layers 602). The vias 604 can be formed in the PCB 204 by drilling a hole through two or more of the layers 602. The drilled hole can be plated (by electroplating) with an electrically conductive material (e.g., copper) that forms the electrical connection between two or more of the layers 602, and the pads 600 at respective layers 602.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. A printed circuit board (PCB), including:
a processing unit;
a plurality of layers; and
a plurality of vias, each via extending through two or more of the layers, wherein
a first via of the plurality of vias has a first pad at a first layer of the plurality of layers,
a second via of the plurality of vias has a second pad at the first layer of the plurality of layers,
a third via of the plurality of vias has a third pad at a second layer of the plurality of layers,
a fourth via of the plurality of vias has a fourth pad at the second layer of the plurality of layers,
the first, the second, the third, and the fourth pads are unused ground pads, wherein the first layer is spaced-apart from the second layer,
a plurality of bridging connectors, wherein
a first bridging connector of the plurality of bridging connectors extends only between the first via and the second via, the first bridging connector connecting the first pad at the first via with the second pad at the second via to form a first heatsink at the first layer that dissipates heat away from the processing unit, and
a second bridging connector of the plurality of bridging connectors extends only between the third via and the fourth via, the second bridging connector connecting the third pad at the third via with the fourth pad at the fourth via to form a second heatsink at the second layer that dissipates heat away from the processing unit.

2. The PCB of claim 1, wherein the first layer and the second layer are internal layers of the plurality of layers.

3. The PCB of claim 1, wherein a fifth via of the plurality of vias has a fifth pad at the first layer of the plurality of layers and a sixth via of the plurality of vias has a sixth pad at the first layer of the plurality of layers, wherein the fifth pad is conjoined with the sixth pad to form a third heatsink at the first layer that dissipates heat away from the processing unit.

4. The PCB of claim 1, wherein a fifth via of the plurality of vias has a fifth pad at the first layer of the plurality of layers, wherein the first pad, the second pad, and the fifth pad are conjoined to form the first heatsink.

5. The PCB of claim 1, wherein the PCB is a network switch chassis board and the processing unit is a network processing unit.

6. The PCB of claim 1, wherein the plurality of layers includes a ground plane layer.

7. An information handling system, comprising:
a processor;
memory media storing instructions executable by the processor to perform operations;
a printed circuit board (PCB), including:
a processing unit;
a plurality of layers; and
a plurality of vias, each via extending through two or more of the layers, wherein
a first via of the plurality of vias has a first pad at a first layer of the plurality of layers,
a second via of the plurality of vias has a second pad at the first layer of the plurality of layers,
a third via of the plurality of vias has a third pad at a second layer of the plurality of layers,
a fourth via of the plurality of vias has a fourth pad at the second layer of the plurality of layers,
the first, the second, the third, and the fourth pads are unused ground pads, wherein the first layer is spaced-apart from the second layer,
a plurality of bridging connectors, wherein
a first bridging connector of the plurality of bridging connectors extends only between the first via and the second via, the first bridging connector connecting the first pad at the first via with the second pad at the second via to form a first heatsink at the first layer that dissipates heat away from the processing unit, and a second bridging connector of the plurality of bridging connectors extends only between the third via and the fourth via, the second bridging connector connecting the third pad at the third via with the fourth pad at the fourth via to form a second heatsink at the second layer that dissipates heat away from the processing unit.

8. The information handling system of claim 7, wherein the first layer and the second layer are internal layers of the plurality of layers.

9. The information handling system of claim 7, wherein a fifth via of the plurality of vias has a fifth pad at the first layer of the plurality of layers and a sixth via of the plurality of vias has a sixth pad at the first layer of the plurality of layers, wherein the fifth pad is conjoined with the sixth pad to form a third heatsink at the first layer that dissipates heat away from the processing unit.

10. The information handling system of claim 7, wherein a fifth via of the plurality of vias has a fifth pad at the first layer of the plurality of layers, wherein the first pad, the second pad, and the fifth pad are conjoined to form the first heatsink.

11. The information handling system of claim 7, wherein the PCB is a network switch chassis board and the processing unit is a network processing unit.

12. The information handling system of claim 7, wherein the plurality of layers includes a ground plane layer.

* * * * *